US006066878A

United States Patent [19]

Neilson

[11] Patent Number: 6,066,878

[45] Date of Patent: May 23, 2000

[54] HIGH VOLTAGE SEMICONDUCTOR STRUCTURE

[75] Inventor: John M. S. Neilson, Norristown, Pa.

[73] Assignee: Intersil Corporation, Palm Bay, Fla.

[21] Appl. No.: 09/108,962

[22] Filed: Jul. 2, 1998

Related U.S. Application Data

[63] Continuation-in-part of application No. 08/966,867, Nov. 10, 1997.

[51] Int. Cl.[7] .................... H01L 29/78

[52] U.S. Cl. .................... 257/342; 257/927

[58] Field of Search .................... 257/330, 331, 257/341, 342, 927

[56] References Cited

U.S. PATENT DOCUMENTS

| | | | |
|---|---|---|---|
| 4,003,072 | 1/1977 | Matsushita et al. | 257/401 |
| 5,200,632 | 4/1993 | Sakurai | 257/341 |
| 5,218,226 | 6/1993 | Slatter et al. | 257/546 |
| 5,438,215 | 8/1995 | Tihanyi | 257/401 |
| 5,519,245 | 5/1996 | Tokura et al. | 257/376 |
| 5,569,941 | 10/1996 | Takahashi | 257/341 |
| 5,723,349 | 3/1998 | Fallica | 437/31 |
| 5,838,027 | 11/1998 | Kim et al. | 257/139 |

*Primary Examiner*—David Hardy
*Attorney, Agent, or Firm*—Rogers & Killeen

[57] ABSTRACT

A high voltage MOSFET with low on-resistance and a method of lowering the on-resistance for a specific device breakdown voltage of a high voltage MOSFET. The MOSFET includes a blocking layer of a first conductivity type having vertical sections of a second conductivity type or the blocking layer may include alternating vertical sections of a first and second conductivity type.

12 Claims, 9 Drawing Sheets

HIGH VOLTAGE SEMICONDUCTOR STRUCTURE

RELATED APPLICATIONS

This is a continuation-in-part of application Ser. No. 08/966,867 filed Nov. 10, 1997.

BACKGROUND OF THE INVENTION

This invention relates to semiconductor devices and more particularly to high voltage MOSFETs.

Metal Oxide Semiconductor Field Effect Transistors ("MOSFETs") are well known and are often used in power applications because the performance characteristics of MOSFETs are generally superior to those of bipolar transistors, i.e., significantly faster switching time, simpler drive circuitry, the absence of a second-breakdown failure mechanism, the ability to be paralleled, and stable gain and response time over a wide temperature range. The major disadvantage of the MOSFET is the high on-resistance of the device.

Conventional prior art vertically conducting MOSFETs are typically fabricated using a vertical double-diffused process ("VDMOS"). The on-resistance of a VDMOS MOSFET can be generally divided into three components: (1) channel resistance, (2) neck resistance, and (3) blocking layer resistance. The channel resistance and the neck resistance of the device may be minimized during device fabrication by methods such as using finer geometries and shallower diffusions. However, the blocking layer resistance, i.e., the resistance of the layer supporting the applied voltage, is highly dependent on the breakdown voltage of the device and minimizing blocking layer resistance must be sacrificed if the device is to withstand high voltages.

FIGS. 1 and 2 show a typical prior art VDMOS MOSFET. In these devices, in order to achieve high voltage capability, the blocking layer is a thick uniformly doped layer to avoid producing high electric fields (and premature breakdown) within the device. When voltage is applied to this device, a depletion region spreads from the P-N junction downward into the uniformly doped N− blocking layer. When the integrated dopant concentration from the junction to the edge of the depletion region reaches about 1.3E12/cm2, the peak electric field at the junction is about 20 volts per micron, which is approximately the field where avalanche breakdown begins. The blocking layer of a device at breakdown contains approximately this same quantity of dopant regardless of the actual breakdown voltage. Minor variations may occur due to variations in the carrier mobility caused by factors such as temperature or dopant concentration. In the prior art device, to increase the breakdown voltage of the device, the dopant must be distributed through a greater vertical thickness causing the blocking layer to have a greater thickness as well as a higher resistivity. When breadown voltage is increased in the prior art device, the on-resistance of the device increases by a factor equal to the increase in breakdown voltage raised to the power of approximately 2.3, which is due primarily to an increase in blocking layer resistance.

Accordingly, it is an object of the present invention to provide a novel high voltage MOSFET and novel method.

It is another object of the present invention to provide a novel high voltage MOSFET with low on-resistance.

It is yet another object of the present invention to provide a novel high voltage MOSFET with low on-resistance and high breakdown voltage.

It is still another object of the present invention to provide a novel blocking layer for a high voltage MOSFET.

It is a further object of the present invention to provide a novel method of lowering the blocking layer resistance of a high voltage MOSFET while maintaining the breakdown voltage.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

The embodiments illustrated herein are shown in two-dimensional views with various regions of the device illustrated as having length and width, these regions are illustrations of only a portion of the device which is comprised of a plurality of cells arranged in a three-dimensional structure.

Further, for the purposes of illustration, the preferred embodiments of the present invention are shown to include specific P and N type regions. It is understood by those skilled in the art that the teachings herein are equally applicable to a device in which the conductivities of the various regions have been reversed.

Figure 1:
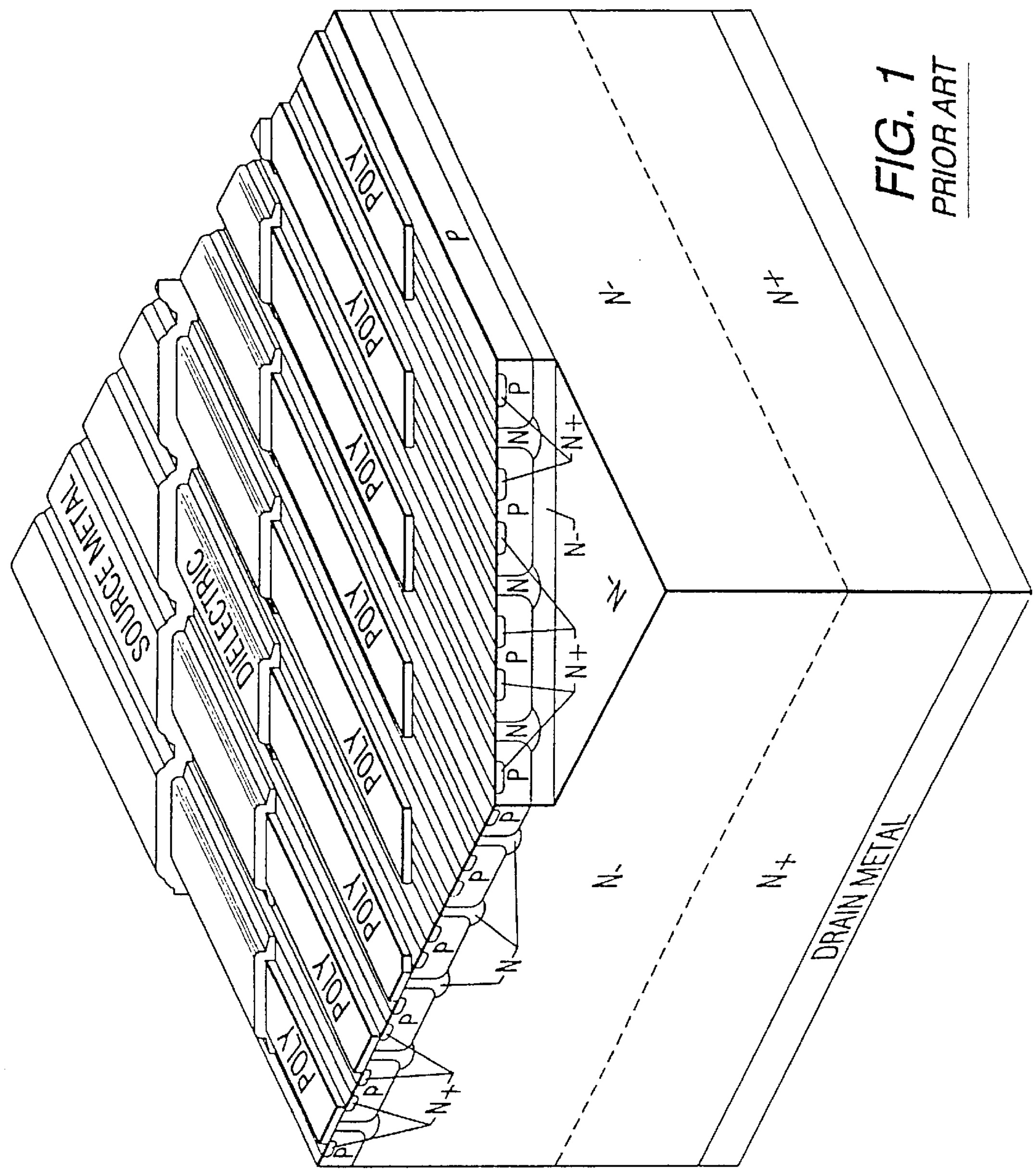
FIG. 1 is a pictorial view of a typical prior art high voltage VDMOS MOSFET.
Figure 2:
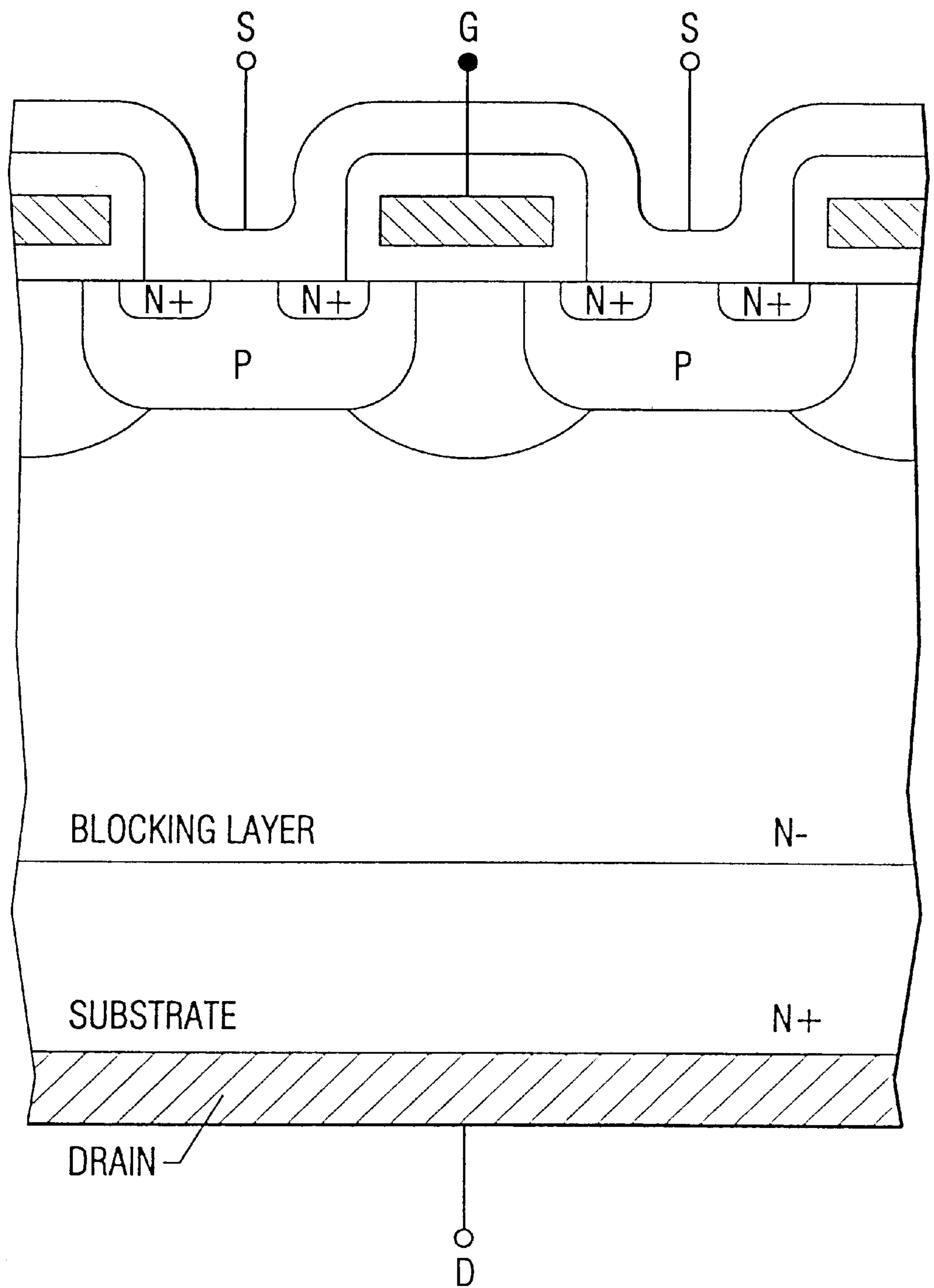
FIG. 2 is a cross-sectional view of the VDMOS MOSFET of FIG. 1.
Figure 3:
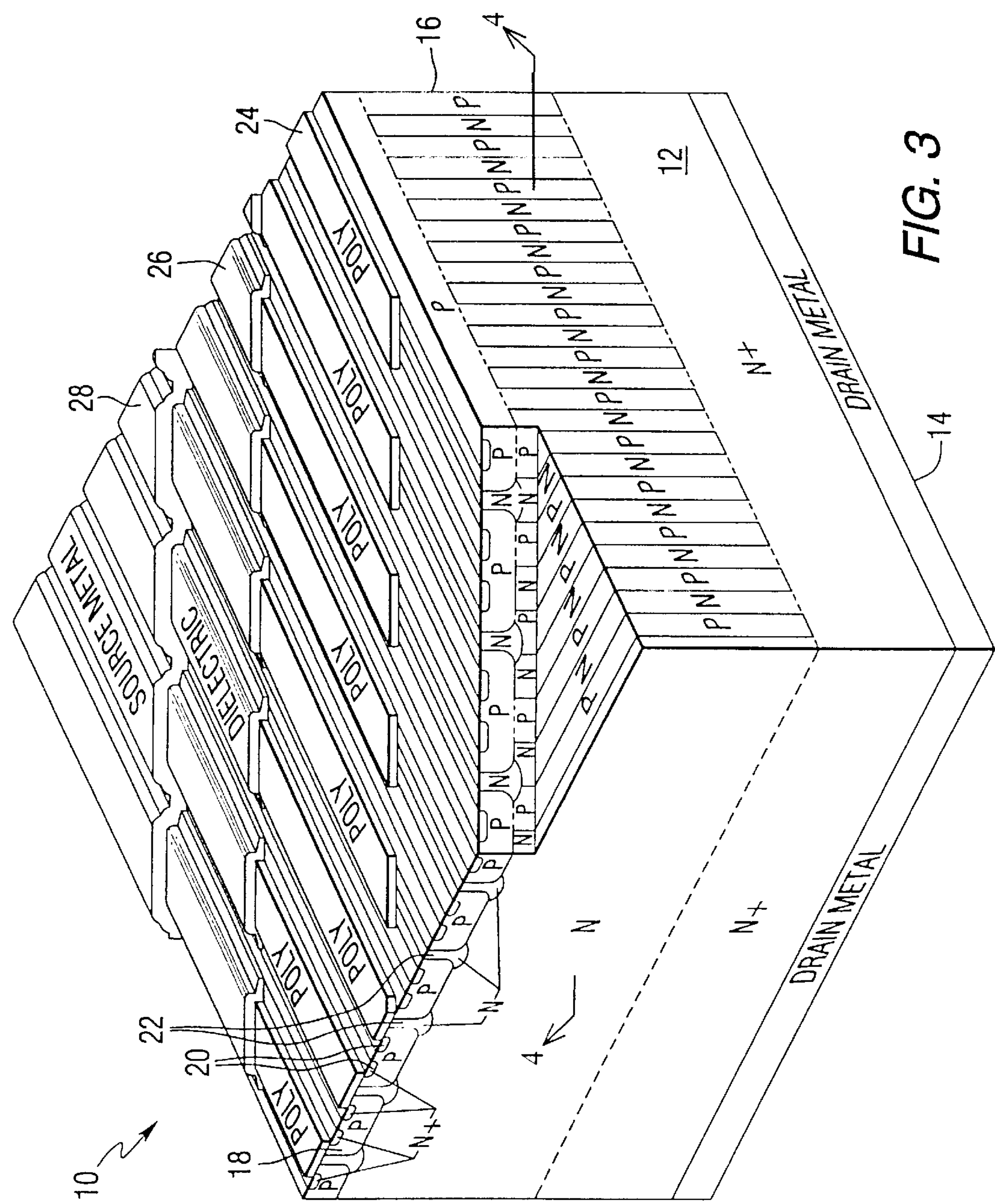
FIG. 3 is a pictorial view of an embodiment of a high voltage VDMOS MOSFET in accordance with the present invention.
Figure 4:
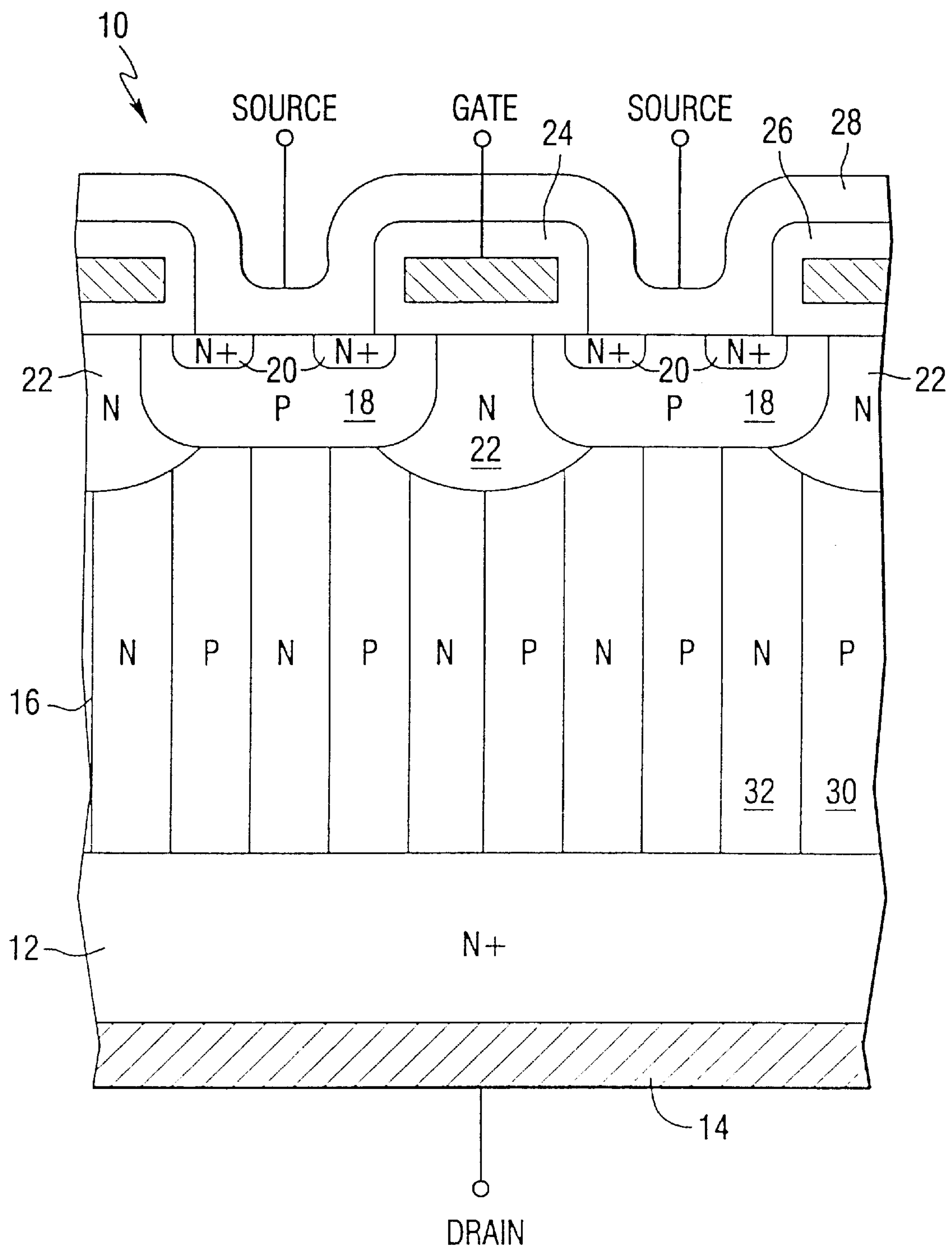
FIG. 4 is a cross-sectional view in elevation taken through lines 4—4 of the VDMOS MOSFET of FIG. 3.

One embodiment of the VDMOS MOSFET in accordance with the present invention is shown in FIGS. 3 and 4. With reference to FIGS. 3 and 4, wherein like elements are given like reference numerals, the VDMOS MOSFET 10 of the present invention comprises an N+ substrate 12 with the drain contact 14 disposed on one side and a blocking layer 16 disposed on the other side. Adjacent the side of the blocking layer 16 opposite the substrate 12 are P well regions 18 and N+ source regions 20. The N regions 22 are disposed between the P well regions 18. A gate poly region 24 overlies the N regions 22 and the portions of the P well regions 18 and the source regions 20 adjacent the N regions 22. A dielectric layer 26 overlies the gate poly region 24 and isolates the gate poly region 24 from the source metal 28.

Figure 5:
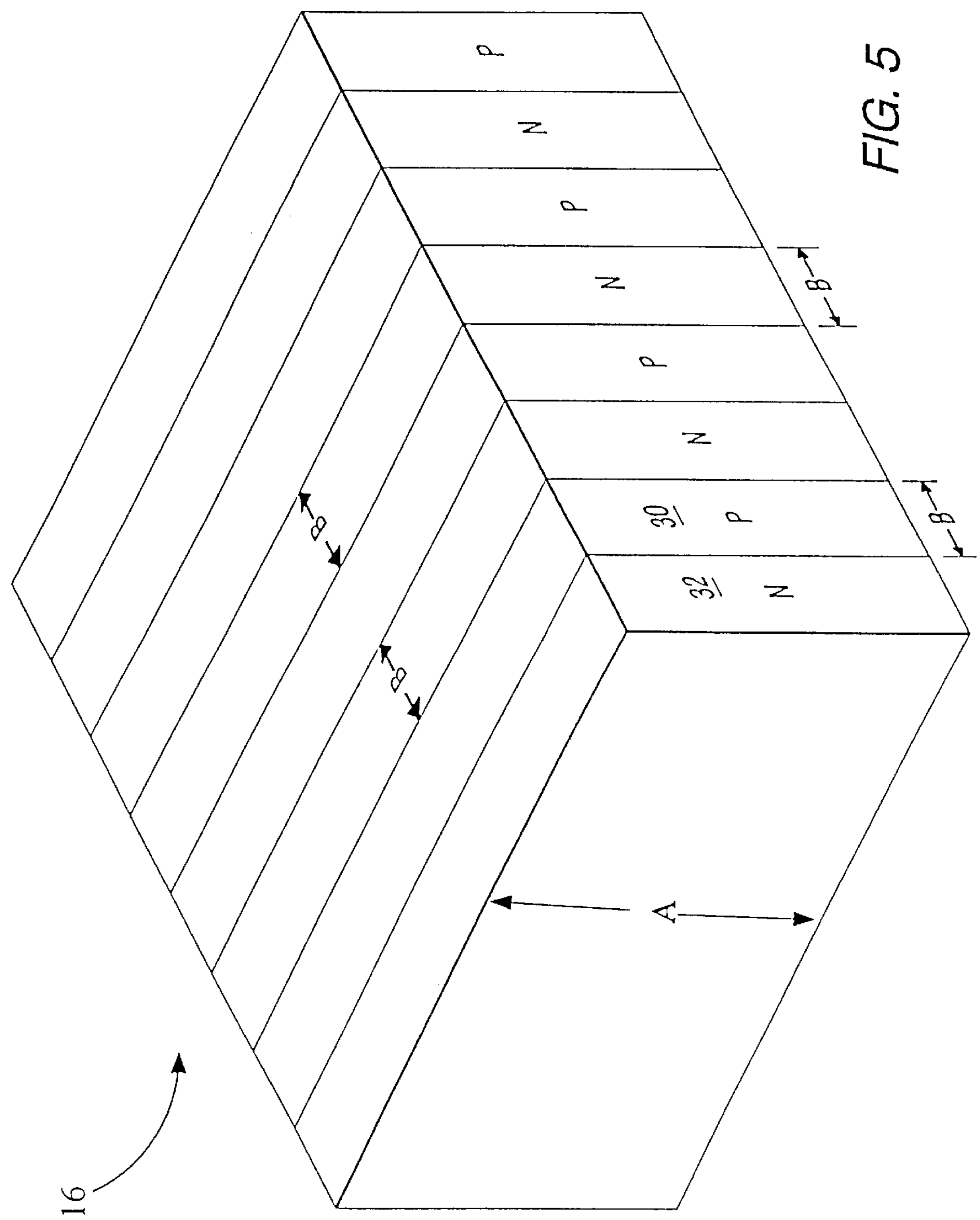
FIG. 5 is a pictorial view of an embodiment of the blocking layer of the high voltage VDMOS MOSFET in accordance with the present invention.

With reference to FIG. 5, in one embodiment of VDMOS MOSFET 10, the blocking layer 16 comprises alternating vertical sections of P and N material, P section 30 and N section 32. Each of the vertical sections 30,32 contains an integrated dopant concentration of about 1E12/cm2 to 2E12/cm2. When voltage is applied to the device, the depletion region spreads horizontally into each side of the vertical sections 30,32. The entire vertical thickness of the blocking layer 16 is depleted before the horizontal field is high enough to produce avalanche breakdown because the total quantity of dopant in each vertical section 30,32 is less than that needed to produce the breakdown field. After the region is fully depleted horizontally, the field continues to build vertically until it reaches the avalanche field of approximately 20 to 30 volts per micron.

The horizontal thickness B of the vertical sections 30,32 should be as small as possible consistent with the method used to form them and must be smaller than the vertical thickness A of the blocking layer 16. The distance between vertical sections of the same conductivity is the pitch of the device and is equal to the horizontal thickness B of the vertical sections of the other conductivity. As shown in the embodiment of FIG. 5, the sections 30,32 have the same horizontal thickness, but different thicknesses may also be used. If one section is thicker than the other, it is preferred to have the current-carrying section be the thicker section. For example, in an N channel device, it is preferred to have thicker N sections, and similarly, in a P channel device, it is preferred to have thicker P sections.

The dopant concentration of the vertical sections 30,32 should be as high as possible (to make the vertical resistance as low as possible) but must be low enough so that breakdown voltage is not reduced. The primary limitation on the maximum dopant concentration is that the concentration in each vertical section must be low enough so that the depletion region can spread horizontally across the entire horizontal thickness B of the vertical sections 30,32 before the horizontal electric field reaches the critical field. The horizontally integrated dopant concentration of each vertical section must be kept below a value of about 2 to 4E12/cm2. The critical field is around 20 to 30 volts per micron which corresponds to an integrated charge of 1.2 to 1.8 electronic charges per square centimeter. Because each vertical section is depleted from both sides, the sections can contain twice that number of dopant atoms.

The exact value of the critical field depends on several factors, including dopant concentration, carrier mobility, section thickness, and ionization integral. As a result of different ionization integrals, the critical field in the vertical direction may be significantly different than the critical field in the horizontal direction. Because the vertical field extends over a long distance, the ionization integral is large, i.e., each free carrier can travel a long distance and can generate a large number of additional free carriers. As a result, the critical field in the vertical direction is about 20 volts per micron. In the horizontal direction, the critical field is closer to 30 volts per micron because the ionization integral is low (short distance for free carrier travel) and the field can be somewhat higher before avalanche breakdown occurs. Thus maximum allowable dopant concentration is higher as the vertical sections are made thinner.

During depletion, the field reaches the critical field of 20 to 30 volts per micron over the entire vertical extent of the blocking layer. In the prior art, the field reaches the critical field only at the P-N junction and then tapers for an average field of 10 to 15 volts per micron across the total thickness of the blocking layer. Thus the vertical thickness of the blocking layer of the VDMOS MOSFET in accordance with the present invention may be less than the vertical thickness of the prior art device.

Figure 6:
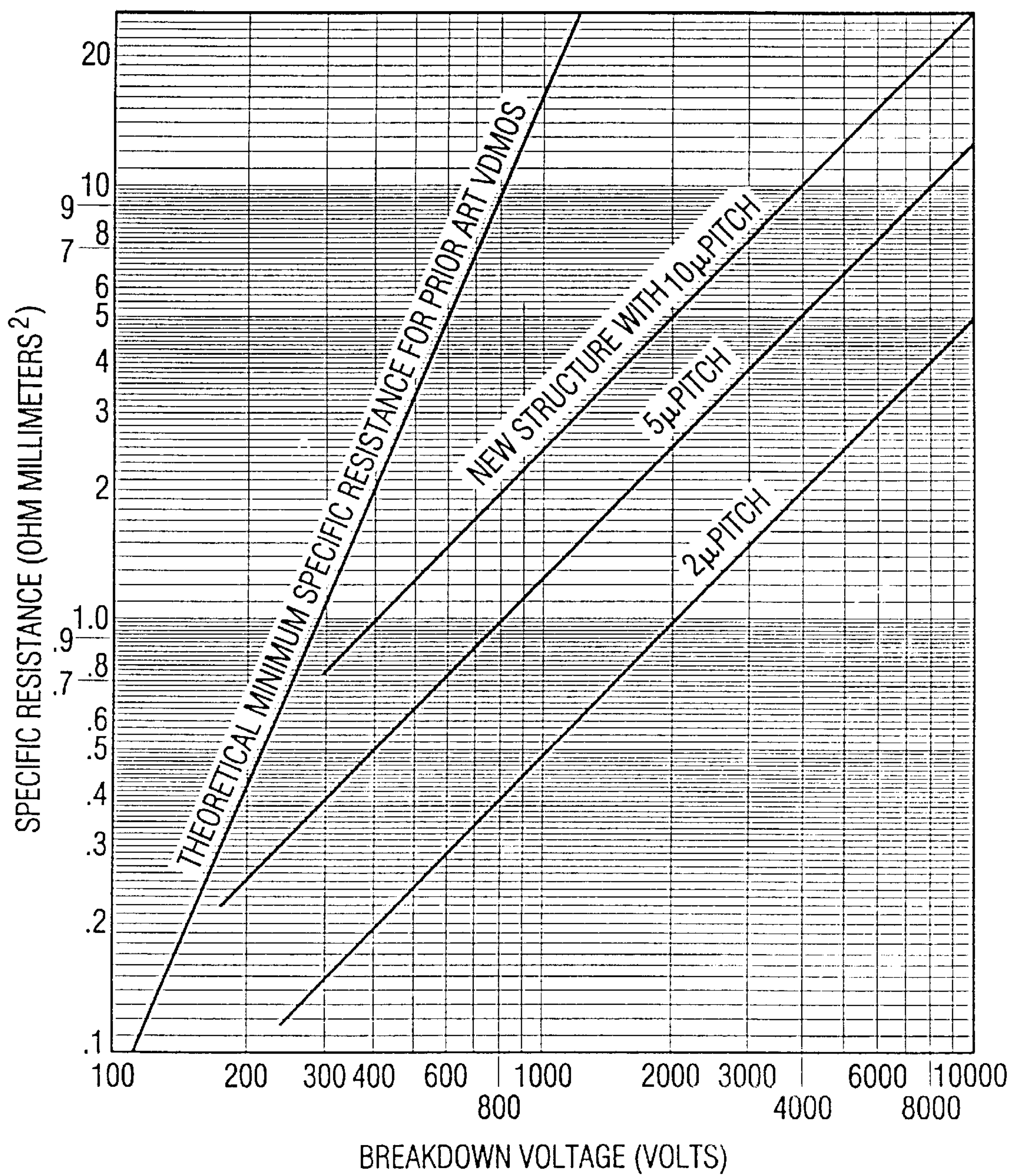
FIG. 6 is a graphical representation of the specific resistance per breakdown voltage of the prior art MOSFET and several embodiments of the MOSFET in accordance with the present invention.

In addition to being thinner, the blocking layer of the present invention has a lower resistance than the blocking layer of the prior art device because current flows vertically through the N sections 32. When breakdown voltage is increased in the present invention, the on-resistance of the device increases only linearly with breakdown voltage as compared to the prior art device where on-resistance increases by a factor equal to the increase in breakdown voltage raised to the power of approximately 2.3. FIG. 6 is a graphical comparison of specific resistance (on-resistance multiplied by area) for a given breakdown voltage of the prior art device and several embodiments of the present invention.

Figure 7:
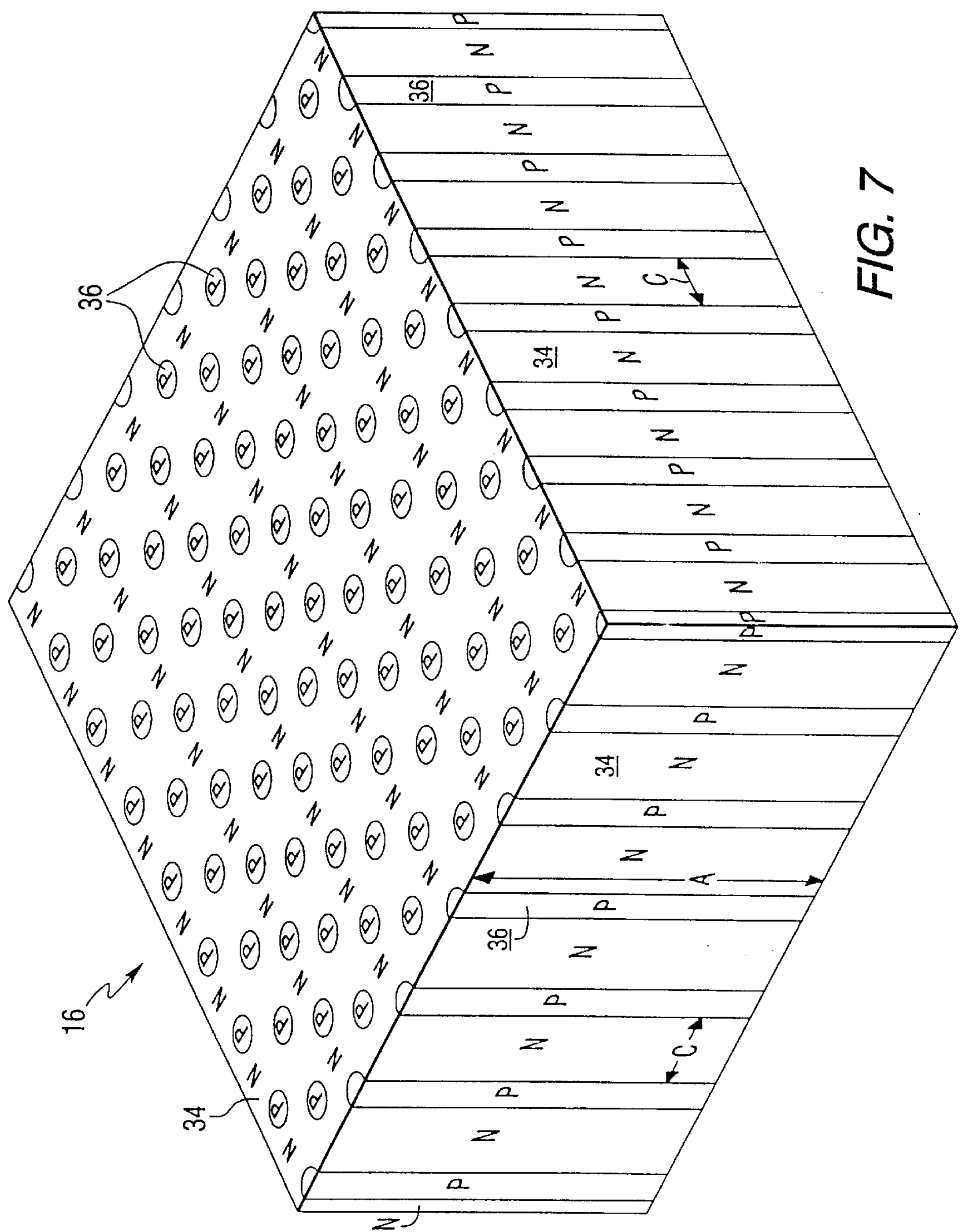
FIG. 7 is a pictorial view of another embodiment of the blocking layer of the high voltage VDMOS MOSFET in accordance with the present invention.

FIG. 7 illustrates another embodiment of the blocking layer 16 in accordance with the present invention. In this embodiment, the blocking layer 16 comprises a horizontal layer 34 of one conductivity type material (N type as illustrated) with vertical sections 36 of a second conductivity material (P type as illustrated). In this embodiment, the vertical sections 36 are cylinders and are uniformly positioned throughout the layer 34. The vertical sections 36 may have horizontal cross-sections other than the circles illustrated. The horizontal distance C between the vertical sections 36 must be smaller then the vertical thickness A of the blocking layer 16.

Figure 8:
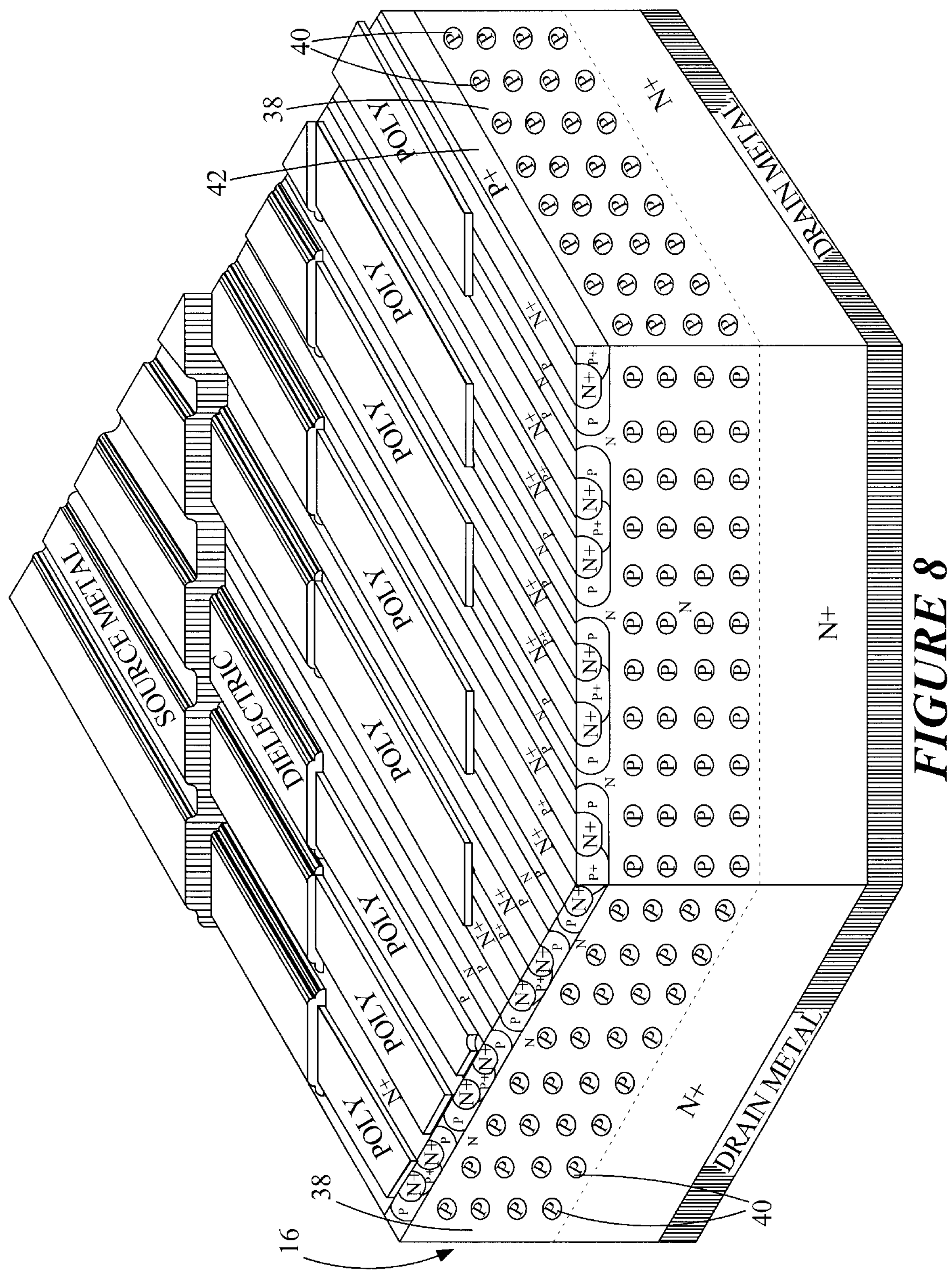
FIG. 8 is a pictorial view of another embodiment of a high voltage VDMOS MOSFET in accordance with the present invention.
Figure 9:
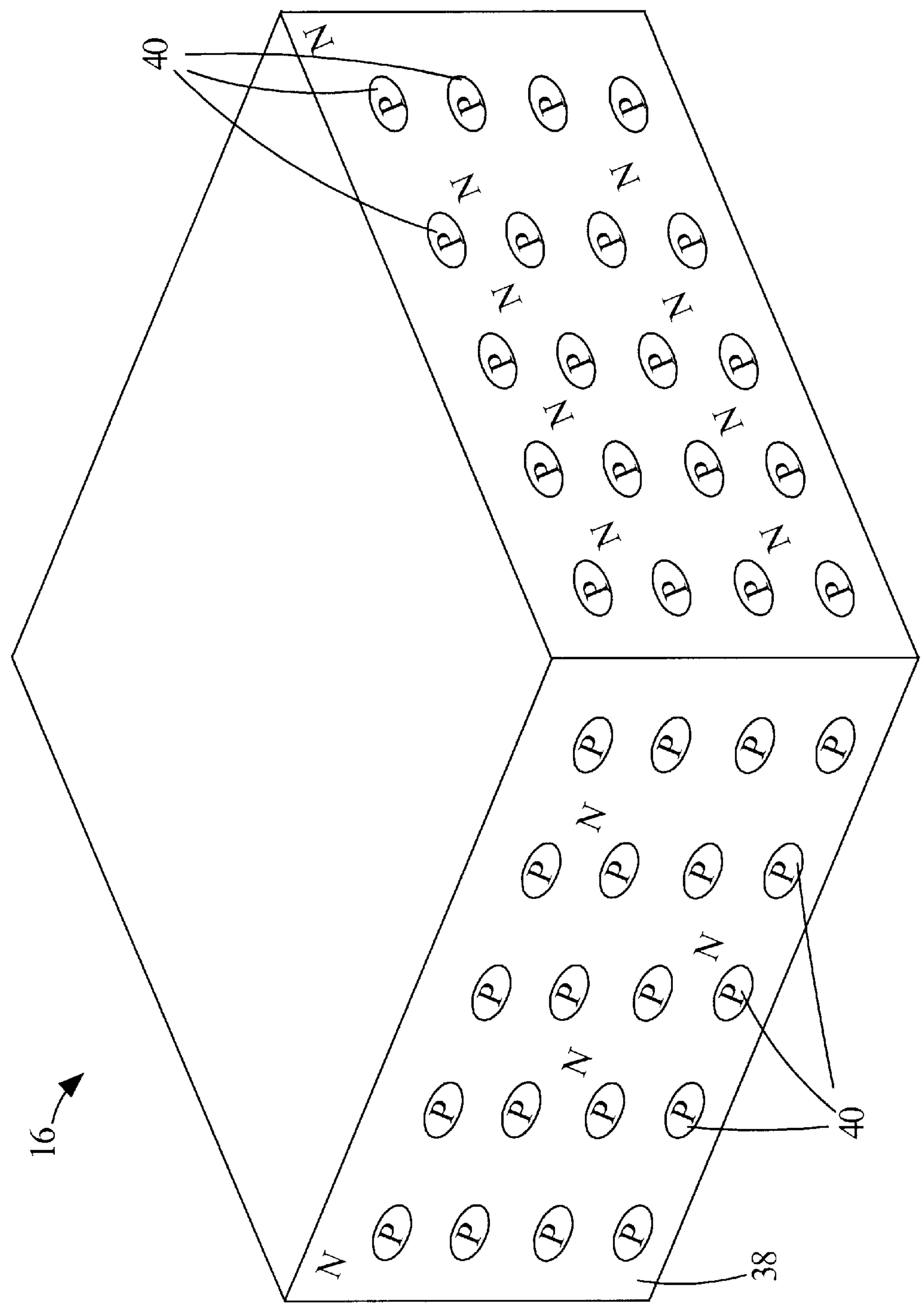
FIG. 9 is a pictorial view of the blocking layer of the high voltage VDMOS MOSFET of FIG. 8.

FIG. 8 illustrates another embodiment of the high voltage VDMOS MOSFET in accordance with the present invention. FIG. 9 illustrates the blocking layer of the embodiment illustrated in FIG. 8. In this embodiment, the blocking layer 16 comprises a horizontal layer 38 of one conductivity type material (N type as illustrated) with floating regions 40 of a second conductivity material (P type as illustrated). In this embodiment, the floating regions 40 are oblate spheroids and are uniformly positioned throughout the layer 38. The floating regions 40 may have other shapes other than the oblate spheroids illustrated in FIGS. 8 and 9.

In the embodiment illustrated in FIGS. 8 and 9, the depletion region begins spreading downward from P+ body region 42. As the depletion region reaches the first horizontal layer of floating regions 40, punchthrough breakdown occurs removing holes from the floating regions 40 giving the floating regions 40 a negative charge. Depletion then spreads outward from the floating regions 40 both vertically and horizontally, fully depleting horizontally between the floating regions and moving downward to the next horizontal layer of floating regions 40. Each floating region 40 still contains a large number of mobile carriers, however, leakage current and high fields are not produced because all of the remaining carriers are at the same potential, with no conductive path connecting the remaining carriers to any of the other floating regions which are at a different potential. The depletion region spreads over the entire vertical thickness of blocking layer 16 with no location within the layer 16 having reached avalanche breakdown voltage.

With the exception of the blocking layer 16, conventional VDMOS processing technology may be used to fabricate the MOSFET 10.

The blocking layer 16 may be fabricated by beginning with an epitaxial layer of one conductivity type (N type for example) and implanting dopant of a second conductivity type (P type for example) to form the vertical sections 32 or 36. The second conductivity type dopant may be implanted using a thick implant mask or a focused ion beam.

In one embodiment, for a 1000 volt device with a 10 micron pitch, the epitaxial layer could have a thickness of 55 microns and a dopant concentration of 4E15/cm3 (1.2 ohm cm) on an N+ substrate. Boron is then implanted with the implant energy varied from several Kev to about 70 Mev to distribute the boron vertically in sections 32 or 36. The total dose required is about 2E13/cm2 for a masked implant, and about half this value for a focused ion beam implant.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A MOSFET having a voltage supporting region comprising a horizontal layer, said layer comprising a first semiconductor type having a plurality of discontinuous floating regions of a second semiconductor type, wherein the regions are spaced in three dimensions.

2. The MOSFET of claim 1 wherein said floating regions are uniformly positioned throughout said layer.

3. A semiconductor device having a voltage supporting region comprising a horizontal layer, said layer comprising a first semiconductor type having floating regions of a second semiconductor type wherein said regions are oblate spheroids positioned in horizontal rows and vertical columns.

4. The semiconductor device of claim 3 wherein said device is a vertically conducting high voltage MOSFET.

5. The semiconductor device of claim 3 wherein said layer has an avalanche breakdown voltage wherein substantially the entire thickness of said layer is depleted before said layer reaches said avalanche breakdown voltage.

6. The semiconductor device of claim 3 wherein said layer has an avalanche breakdown voltage, and wherein if the electric field in said layer reaches said avalanche breakdown voltage, the electric field over substantially the entire vertical thickness of said layer reaches said avalanche breakdown voltage.

7. A horizontal blocking layer for a vertically conducting MOSFET comprising a layer of first semiconductor type having a plurality of discontinuous and uniformly positioned floating regions of a second semiconductor type, wherein the regions are spaced in three dimensions.

8. The blocking layer of claim 7 wherein said floating regions are substantially spheroids or oblate spheroids and are positioned uniformly to form horizontal rows and vertical columns within said layer.

9. A MOSFET comprising:

a source and gate region;

a drain region; and a layer between said source and gate region and said drain region and adjacent said source and gate region, said regions and layer being horizontal and substantially parallel and extending laterally across said MOSFET, said layer comprising a first semiconductor type having a plurality of discontinuous floating regions of second semiconductor type, wherein said floating regions are spaced in three dimensions.

10. A MOSFET comprising:

a source and gate region;

a drain region; and a layer between said source and gate region and said drain region and adjacent said source and gate region, said regions and layer being horizontal and substantially parallel and extending laterally across said MOSFET, said layer comprising a first semiconductor type having floating regions of second semiconductor type, said floating regions are substantially spheroids or oblate spheroids and are positioned uniformly to form horizontal rows and vertical columns within said layer.

11. A vertically conducting high voltage MOSFET having a voltage supporting region comprising a horizontal layer of a first semiconductor type having floating regions of a second semiconductor type, wherein said floating regions are oblate spheroids, said MOSFET having an avalanche breakdown voltage, wherein if the electric field in said layer reaches said avalanche breakdown voltage, the electric field over substantially the entire vertical thickness of said layer reaches said avalanche breakdown voltage.

12. A semiconductor device having a voltage supporting region comprising a horizontal layer of first conductivity type, and having oblate spheroids of second conductivity type dispersed in the layer for improving the breakdown voltage of the semiconductor device.

* * * * *